US006861955B2

(12) United States Patent
Youssef

(10) Patent No.: US 6,861,955 B2
(45) Date of Patent: Mar. 1, 2005

(54) METHOD AND CIRCUIT FOR DETECTING THE STATE OF A SWITCH

(76) Inventor: Tom Youssef, 3131 Renaissance Dr., Dallas, TX (US) 75287

( * ) Notice: Subject to any disclaimer, the term of this patent is extended or adjusted under 35 U.S.C. 154(b) by 99 days.

(21) Appl. No.: 10/404,885

(22) Filed: Mar. 31, 2003

(65) Prior Publication Data
US 2004/0189481 A1 Sep. 30, 2004

(51) Int. Cl.[7] ............................................. G08B 21/00
(52) U.S. Cl. ....................... 340/635; 340/644; 340/661
(58) Field of Search ................. 340/635, 644, 340/645, 649, 650, 657, 660, 661, 662; 361/88, 103, 179; 327/396, 425

(56) References Cited

U.S. PATENT DOCUMENTS

| 4,467,391 | A | * | 8/1984 | Refoy et al. ................ 361/179 |
| 4,849,847 | A | * | 7/1989 | McIver et al. ................ 361/88 |
| 5,689,209 | A | * | 11/1997 | Williams et al. ............. 327/425 |
| 5,966,311 | A | * | 10/1999 | Stemporzewski et al. ... 700/281 |
| 6,590,440 | B1 | * | 7/2003 | Williams et al. ............. 327/396 |
| 6,614,288 | B1 | * | 9/2003 | Dagan et al. ................ 327/365 |
| 6,678,829 | B1 | * | 1/2004 | Teggatz et al. .............. 713/300 |
| 6,759,812 | B2 | * | 7/2004 | Ito et al. ...................... 315/291 |

* cited by examiner

Primary Examiner—Van T. Trieu
(74) Attorney, Agent, or Firm—Lisa K. Jorgenson; Andre M. Szuwalski

(57) ABSTRACT

A circuit for detecting the state of a switch having a first circuit which substantially periodically attempts to provide a voltage across the switch. A second circuit detects the state of the switch by monitoring the voltage across the switch, and responsively generates an output having a voltage level representative of the voltage appearing across the switch.

25 Claims, 3 Drawing Sheets

METHOD AND CIRCUIT FOR DETECTING THE STATE OF A SWITCH

BACKGROUND

1. Field of Invention

The present invention relates to a circuit and method for detecting the state of a switch and, more particularly, not by way of limitation, to a circuit for and method of detecting the state of a switch while reducing the current drain on a power source.

2. History of Related Art

It is well known in industries where cash and/or other valuables are stored in point-of-sale devices or containers accessible by the public that these containers may be susceptible to theft or break-in. Sometimes, it is not immediately evident that tampering has occurred. Other times, it may be useful to alert people in the area or the authorities that the tampering is taking place. For these reasons, tamper detectors have been developed. These detectors generally function by detecting the state of a switch using electrical circuitry. The switch is typically electromechanical in nature such that excessive tampering or movement of the associated container causes the switch to change electrical state. When a change of state of the switch is detected, a positive indication for tampering is given.

One such detector illustrated in FIG. 1 shows a discreet solution to detect a tamper condition. In FIG. 1, a switch 4 is normally closed, grounding a tamper pad 8 and discharging a static current from a battery 6 via a resistor R1. When tampering occurs, switch 4 opens, resistor R1 pulls tamper pad 8 to the positive terminal of the battery, and the static current from the battery 6 through resistor R1 will be cut off. The rise in voltage on tamper pad 8 is detected and utilized to indicate that a tamper has occurred.

One problem with detectors such as that illustrated in FIG. 1 is that the battery is continuously drained when the switch 4 is normally closed, thus shortening the battery life. This requires the battery to be changed periodically and increases the possibly that a dead battery may be in place at the time the item or container is tampered with. For the foregoing reasons, there is a need for a tamper detection circuit or device that reduces the power drain on the battery, thus preserving the life of the battery.

SUMMARY OF THE INVENTION

The present invention relates to a circuit and method for detecting the state of a switch. More particularly, the present invention relates to a detection circuit for and method of detecting the state of a switch while reducing the current drain on a power source. In one aspect, the invention includes a first circuit for coupling a first terminal of the switch to a first voltage level and temporarily coupling a second terminal of the switch to a second voltage level. A second circuit is provided for maintaining the second terminal of the switch at approximately the second voltage level when the switch changes from a first state corresponding to a no-tamper condition to a second state corresponding to a tamper condition.

The first circuit includes a transistor coupled between the second terminal of the switch and a power supply. The first circuit further includes a third circuit for a substantially regularly switching the transistor between on and off states.

The second circuit includes a second transistor coupled between the second terminal of the switch and the power supply. The second circuit may also include a flip-flop logic element with an input coupled to the second terminal of the switch and an output coupled to a control terminal of the second transistor. The output of the flip-flop logic element indicates if the switch has changed states. A processing circuit may be coupled to the output of the flip-flop to respond thereto.

In another aspect, the invention includes a method for detecting the state of the switch, having the steps of first temporarily attempting to provide a non-zero voltage potential across the switch which is approximately equal to the voltage across a voltage source (corresponding to a logic high state), and maintaining the non-zero voltage across the switch when the non-zero voltage has been successfully provided across the switch.

BRIEF DESCRIPTION OF THE DRAWINGS

The present invention will now be described in more detail with reference to preferred embodiments of the present invention, given only by way of examples, and illustrated in the accompanying drawings in which.

DETAILED DESCRIPTION

Figure 2:
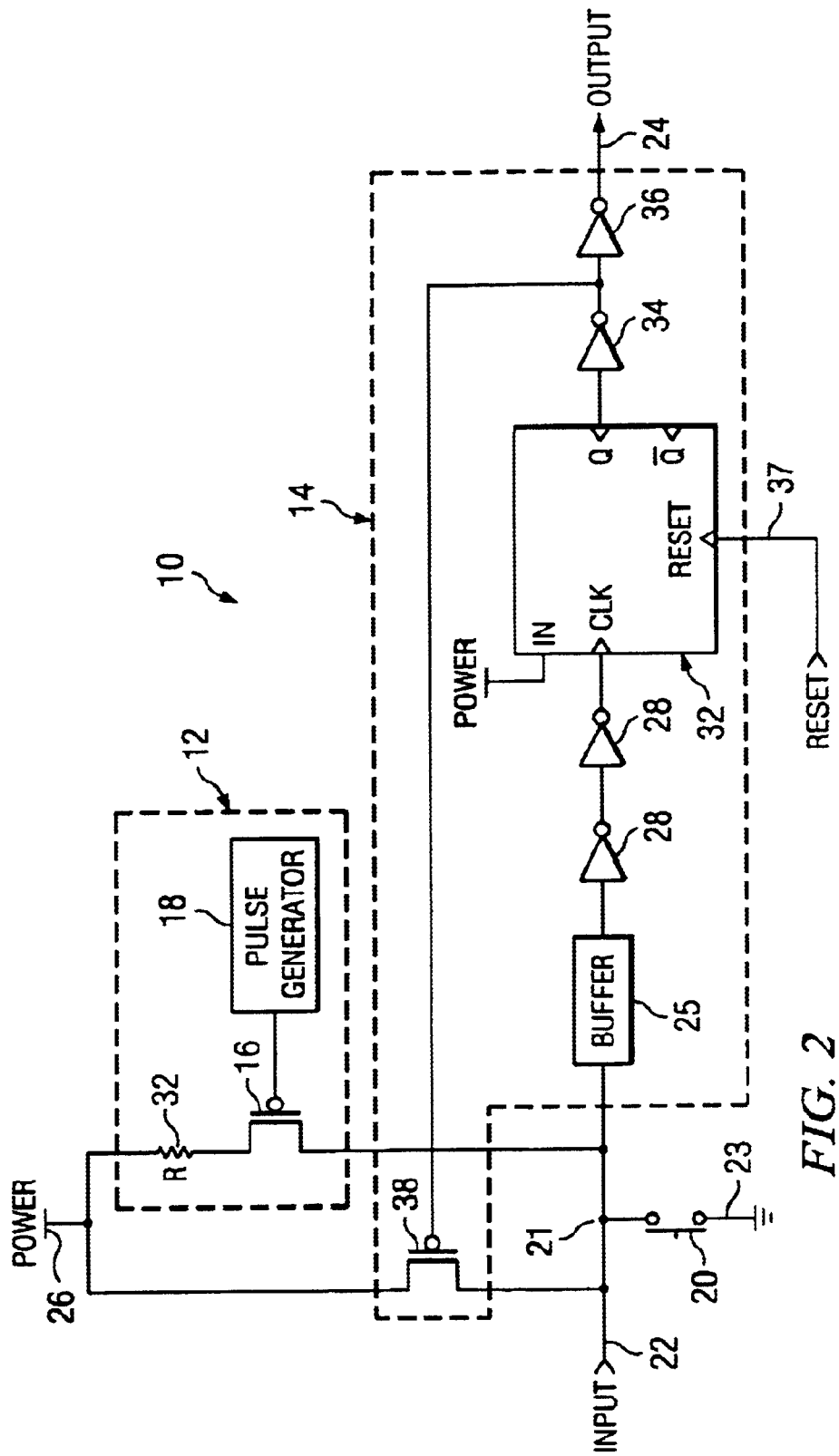
FIG. 2 illustrates a circuit for detecting the state of a switch according to the principles of the present invention.

Referring now to FIG. 2, there is shown a schematic of a detection circuit 10 according to the principles of the present invention. A first terminal 23 of the switch 20, whose state (open or closed) is to be detected, is coupled to a reference voltage level, such as ground (first voltage). A second terminal 21 of the switch 20 may be coupled to circuit 10 by an input 22 thereof. The circuit 10 attempts to pull the second terminal of switch 20 to a second voltage. An output 24 of the circuit 10 is adapted to have a value that represents the state of the switch 20.

Referring still to FIG. 2, the switch 20 may be integral to circuit 10, in the same chip as circuit 10, within the same package as circuit 10, or external to the package. Furthermore, switch 20 may be any type of switch, such as an electro-mechanical or electrical switch. For example, switch 20 may be a switch coupled to a point-of-sale device such as a cash register or any container or housing that is selectively locked.

It is understood that output 24 of circuit 10 may be coupled to a device (not shown), such as a processor, to alert of a tamper condition. Furthermore, the device coupled to the output 24 may or may not be integrated on the same chip, located in the same package or located on the same circuit board as circuit 10.

Circuit 10 may include a first circuit 12 and a second circuit 14. The first circuit 12 temporarily couples the second terminal of switch 20 to approximately the voltage across the power supply 26. The first circuit 12 may include a first transistor 16, such as a p-channel field effect transistor, and a pulse generating circuit 18. Pulse generating circuit 18 may generate any number or series of pulses having virtually any time-based relationship to each other, including substantially periodic and a periodic pulses. It is understood that the maximum time between consecutive occurrences of the output of pulse generating circuit 18 being in the active (low) state may be based in part upon the maximum desired response time of circuit 10 and the maximum desired current draw thereof. Pulse generating circuit 18 may be coupled to the control terminal of the transistor 16. Furthermore, the source of the transistor 16 may be coupled to the power supply 26, such as the positive terminal of a battery (not shown), through a resistor 32. The drain of transistor 16 may be coupled to input 22 and second terminal 21 of switch 20.

Transistor 16 is smaller in size and has a weaker drive strength relative to switch 20. This is preferable because the voltage at the second terminal 21 of switch 20 should only change substantially when switch 20 is in the open state. In particular, when the output of pulse generating circuit 18 is pulsed to an active (low) logic state, transistor 16 is activated (closed state). Activated transistor 16 attempts to pull the second terminal 21 of switch 20 towards a voltage approximately equal to the voltage of power supply 26. When switch 20 is closed, the second terminal 21 of switch 20 is grounded. Because the drive strength of switch 20 is substantially greater than the drive strength of transistor 16, activated transistor 16 cannot pull the second terminal 21 substantially towards the voltage across power supply 26. Conversely, when switch 20 is in the open state, activation of transistor 16 pulls the second terminal 21 of switch 20 to the voltage appearing across power supply 26.

Second circuit 14 is adapted to detect a change in voltage across switch 20 and signal such a change. In particular, second circuit 14 detects a change in voltage across switch 20 by at least a predetermined voltage amount. Further, second circuit 14 is adapted to continue to indicate the change in voltage by at least the predetermined voltage amount until a signal is received that places circuit 10 in a reset state. The reset state of circuit 10 may comprise closing switch 20 and clearing any data values stored in detection circuit 10.

The second circuit 14 may include a buffering element 25, logic inverters 28, a flip-flop logic element 32, logic inverters 34 and 36, and a second transistor 38. The input of buffering element 25 is coupled to input 22 of circuit 10. The output of buffering element 25 is coupled to the clock input of flip-flop element 32 through logic inverters 28.

Buffering element 25 has an input switching threshold voltage of approximately the above-mentioned predetermined voltage amount. In that regard, the output voltage of buffering element 25 will change state when the switch 20 is opened and the second terminal 21 is pulled towards the voltage of the power supply 26 by transistor 16 so as to surpass the predetermined voltage amount. In one embodiment, buffering element 25 has a TTL input switching voltage. However, in alternative embodiments, buffering element 25 may have other input switching threshold voltages.

Flip-flop element 32 has a clock input coupled to the output of the buffering element 25, and an output (Q) coupled to the output 24 of circuit 10 through logic inverters 34 and 36. The output of flip-flop element 32 may be further coupled to yet another circuit (not shown) that may take desired remedial actions in response to a change in state appearing at the output of flip-flop element 32. With the data input of flip-flop element 32 coupled to power supply 26, flip-flop 32 will clock in a logic high value on the triggering edge of the signal appearing on the output from the output of buffering element 25. Furthermore, flip-flop element 32 has an asynchronous reset input 37 for selectively placing flip-flip element 20 in a logic low reset state. Alternatively, flip-flop element 32 may clock in a logic low value and be asynchronously placed in a logic high set state. It is understood that either or both outputs of the flip-flop element 32, output Q or the logical inverse thereof, may be utilized to generate the output of circuit 10.

Second transistor 38 may be a p-channel field effect transistor. The second transistor 38 is activated to maintain the voltage on input 22 (second terminal 21 of switch 20) when switch 20 is open. The control terminal of the second transistor 38 is coupled to the output of flip-flop element 32 through logic inverter 34. The output of flip-flop element 32 selectively activates the second transistor 38 to maintain the voltage on the input 22 (second terminal 21 of switch 20) of the circuit 10 by applying a logic low signal to the control terminal of the second transistor 38. The source of second transistor 38 is coupled to power supply 26 and the drain is coupled to input 22 of circuit 10.

In operation, switch 20 is coupled to a container or other device to be monitored, and at second terminal 21 to input 22 of circuit 10. The circuit 10 is first initialized by placing circuit 10 in the reset state (Step 1 of FIG. 3). In placing circuit 10 in the reset state, switch 20 is closed, flip-flop element 32 receives a reset signal and is responsively placed in the reset state, and transistor 38 is deactivated. Because switch 20 is closed (no tamper condition), input 22 (second terminal 21 of switch 20) of circuit 10 is grounded. No voltage appears across the switch 20 at this time. The output 24 of circuit 10 is in the logic low state.

Figure 1:
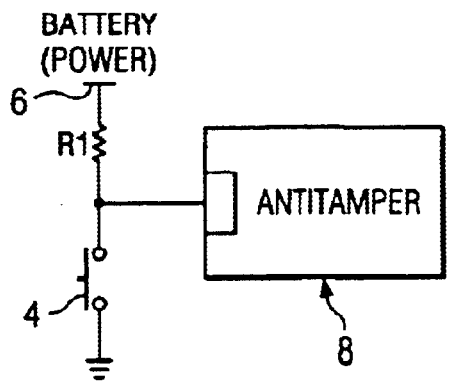
FIG. 1 illustrates a prior art solution to detecting the state of a switch.
Figure 3:
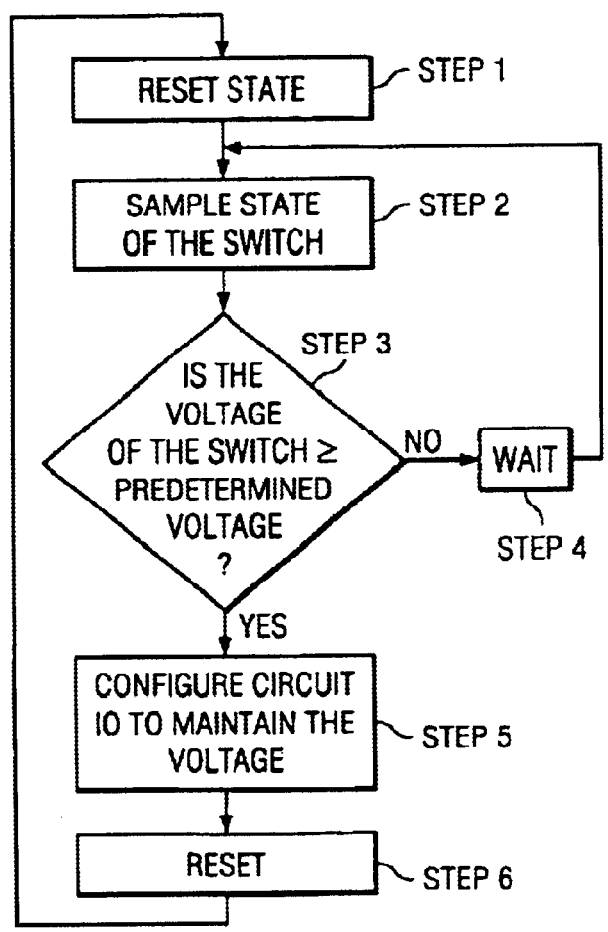
FIG. 3 is a block diagram illustrating a method for determining the state of a switch according to the principles of the present invention.

Second, after circuit 10 has been reset, circuit 12 periodically, regularly or occasionally attempts to provide a non-zero voltage across switch 20 by activating first transistor 16 (Step 2 of FIG. 3). In the no-tamper condition, switch 20 is closed and the buffering element 25 will not receive an input signal above the predetermined voltage level because of switch 20 having a substantially larger drive strength than transistor 16. The voltage signal appearing at the clock input of flip-flop 32 will not transition and therefore will not cause a logic high to be clocked into flip-flop 32. Because the output of flip-flop 32 remains in the reset (logic low) state, second transistor 38 will not be turned on and output 24 will remain low.

In the event the container associated with switch 20 is tampered with, switch 20 is turned off and/or placed in the open state. When first transistor 16 is subsequently activated by pulse generating circuit 18, circuit 12 is able to pull second terminal 21 towards the voltage across power supply 26, and thereby provide a non-zero voltage across switch 20 (Step 3 of FIG. 3). With the input switching threshold voltage of buffering element 25 being between ground and the voltage of power supply 26, the output of buffering element 25 transitions to a logic high state and triggers flip-flop 32 to clock in a high logic value (step 4 of FIG. 3). With flip-flop 32 storing a logic high data value, the output of flip-flop 32 is in the logic high state and transistor 38 is turned on as a result. Now being activated, transistor 38 pulls the input 22 to the voltage across power supply 26 and thereafter maintains input 22 there at (step 5 of FIG. 3). The output 24 will also transition at a logic high value, thereby indicating a change of state (change in voltage) of switch 20 and therefore a tamper condition. Circuit 10 is reset by again closing switch 20 and resetting flip-flop element 32 (Step 6 of FIG. 3).

Figure 4:
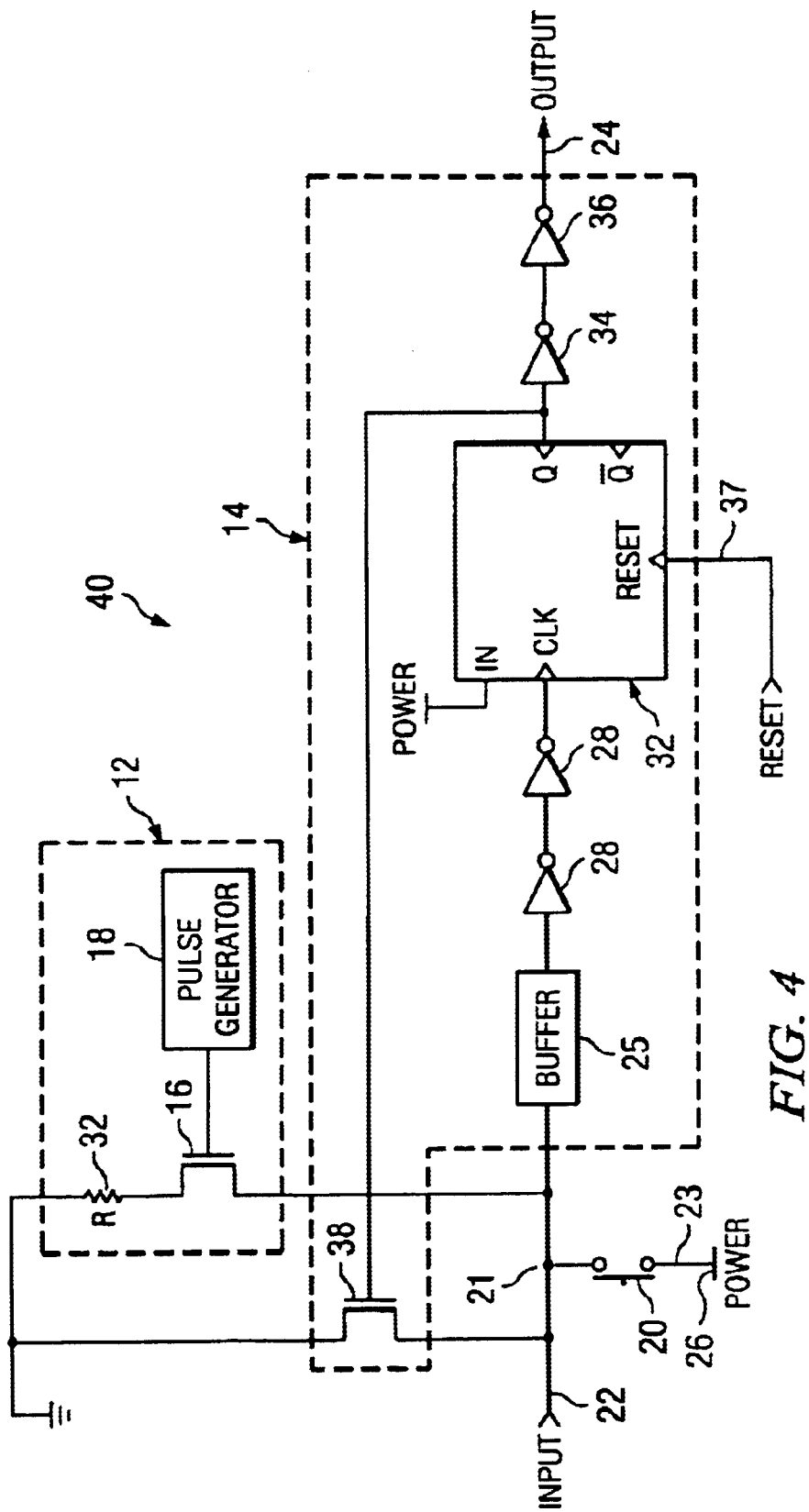
FIG. 4 illustrates an alternative embodiment of the circuit of FIG. 2 according to the principles of the present invention.

Referring now to FIG. 4, there is shown a circuit 40 according to an alternative embodiment of the present invention. In this embodiment, the transistors 16 and 38 are N-channel field effect transistors. Further, input 22 (first terminal 23 of switch 20) is connected to power supply 26. The source of transistor 16 is connected through resistor 32 to ground and the drain of transistor 16 is coupled to the second terminal 21 of switch 20. Similarly, the second transistor 38 is coupled between the second terminal of switch 20 and ground.

When the output of pulse generating circuit 18 is in the active logic high state, the first transistor 16 is activated and will attempt to ground the input 22 (second terminal 21 of switch 20). In the event switch 20 is closed, transistor 16 cannot ground input 22 because of the relative drive strength differences between switch 20 and first transistor 16, and the input to buffering element 25 will remain above the corresponding input switching threshold voltage as a result. Flip-flop element 32 will, therefore not clock in a logic high value and the second transistor 38 will not be activated. In the event switch 20 is open, activated transistor 16 will be able to ground input 22, which will drop the voltage at input 22 below the input switching threshold voltage of buffering element 25. This causes the output of buffering element 25 to change state and causes flip-flop element 32 to clock in a logic high value. With flip-flop 32 storing a data high value, transistor 38 will be activated, thus maintaining the voltage level of the input 22 at the ground potential and output 24 will be in a logic high state to indicate that switch 20 has changed state.

Transistors 16 and 38 of circuits 10 and 40 are shown as being MOSFET transistors. It is understood that transistors 16 and 38 may be different types of transistors, such as bipolar junction transistors (BJTs).

Although a preferred embodiment of the invention has been illustrated in the accompanying drawings and described in the foregoing specification, the circuit for detecting the state of a switch is capable of numerous rearrangements and modifications of parts and elements without departing from the spirit of the invention.

I claim:

1. A circuit for detecting the state of a switch, comprising:
   a first circuit for coupling a first terminal of a switch to a first voltage level while temporarily coupling a second terminal of the switch to a second voltage level; and
   a second circuit for maintaining the second terminal of the switch at approximately the second voltage level upon the voltage across the switch exceeding a predetermined threshold level between the first voltage level and the second voltage level.

2. The circuit according to claim 1, wherein the first circuit comprises a first transistor, and wherein the switch has a greater drive strength than the drive strength of the first transistor.

3. The circuit according to claim 2, wherein the first circuit further comprises a third circuit coupled to the first transistor for generating a signal that substantially regularly switches the first transistor between open and closed states.

4. The circuit according to claim 2, wherein the first transistor is an n-type field effect transistor.

5. The circuit according to claim 1, wherein the second circuit comprises a transistor coupled between the second terminal of the switch and a terminal of a voltage source providing the second voltage level.

6. The circuit according to claim 5, wherein the second circuit further comprises a flip-flop logic element having an input coupled to the second terminal of the switch and an output coupled to a control terminal of the transistor.

7. The circuit according to claim 6, wherein the input of the flip-flop is a clock input.

8. The circuit according to claim 6, wherein the output of the circuit is coupled to the output of the flip-flop element.

9. The circuit according to claim 6, wherein the second circuit further comprises a buffer element coupled between the second terminal of the switch and the input of the flip-flop logic element.

10. The circuit according to claim 9, wherein the input switching threshold voltage of the buffer element is the predetermined threshold level between the first voltage level and the second voltage level.

11. The circuit according to claim 9, wherein the buffer element is a TTL buffer element.

12. The circuit according to claim 6, wherein the flip-flop logic element comprises a terminal for selectively placing the flip-flop element in a predetermined state.

13. The circuit of claim 12, wherein the flip-flop element includes at least one data input coupled to one of the first voltage level and the second voltage level, and the predetermined state corresponds to the other of the first voltage level and the second voltage level.

14. The circuit according to claim 13, wherein the first transistor is a p-type field effect transistor.

15. A circuit for detecting the state of a switch having a first terminal coupled to a first voltage level and a second terminal, comprising:
   a first transistor coupled between a voltage supply terminal having a second voltage level and the second terminal of the switch;
   a signal generating circuit coupled to the control terminal of the first transistor for occasionally activating the first transistor;
   a second transistor coupled between the voltage supply terminal and the second terminal of the switch; and
   a flip-flop element coupled between the second terminal of the switch and the control terminal of the second transistor, the flip-flop element activating the second transistor upon the voltage of the second terminal approaching a predetermined value between the first and second voltage levels.

16. The circuit according to claim 15, further comprising a buffer element coupled between the second terminal of the switch and an input of the flip-flop element.

17. The circuit according to claim 16, wherein the buffer element is a TTL buffer element.

18. The circuit according to claim 15, wherein the flip-flop element comprises a control terminal for selectively placing the flip-flop in a predetermined state.

19. The circuit according to claim 15, wherein the first and second transistors are field effect transistors.

20. The circuit according to claim 15, wherein the first transistor is substantially periodically activated by the signal generating circuit.

21. The circuit according to claim 15, wherein the switch is sized substantially larger and than the size of the first transistor.

22. A method for detecting the state of a switch, comprising the steps of:
   temporarily attempting to provide a non-zero voltage potential across the switch, the non-zero voltage being approximately the voltage across a voltage source; and
   upon the voltage across the switch being greater than a predetermined voltage level less than the voltage across the voltage source, maintaining the voltage across the switch to be in excess of the predetermined voltage level.

23. The method according to claim 22, wherein the step of temporarily attempting to provide a non-zero voltage across the switch comprises the step of occasionally coupling a voltage supply terminal having a first voltage to a terminal of the switch.

24. The method of claim 23, wherein the voltage of the voltage supply terminal has a voltage greater than the predetermined voltage level.

25. The method according to claim 22, wherein the step of maintaining the voltage comprises the steps of:

determining if the voltage of a terminal of the switch is above the predetermined voltage level; and selectively coupling the voltage supply terminal having a first voltage to the terminal of the switch based upon the step of determining.

* * * * *